US007001782B1

(12) United States Patent
Diana et al.

(10) Patent No.: US 7,001,782 B1
(45) Date of Patent: Feb. 21, 2006

(54) METHOD AND APPARATUS FOR FILLING INTERLAYER VIAS ON FERROELECTRIC POLYMER SUBSTRATES

(75) Inventors: Daniel C. Diana, Portland, OR (US); Ebrahim Andideh, Portland, OR (US); Richard M. Steger, Beaverton, OR (US); Valery Dubin, Portland, OR (US); Ming Fang, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/747,824

(22) Filed: Dec. 29, 2003

(51) Int. Cl.
*H01L 21/00* (2006.01)

(52) U.S. Cl. .............................. 438/3; 438/99; 438/637; 257/40; 257/295

(58) Field of Classification Search .................... 438/3, 438/637; 257/295
See application file for complete search history.

(56) References Cited

U.S. PATENT DOCUMENTS

| | | | |
|---|---|---|---|
| 6,670,659 B1 * | 12/2003 | Gudesen et al. | 257/295 |
| 2002/0197844 A1 * | 12/2002 | Johnson et al. | 438/618 |
| 2003/0017627 A1 * | 1/2003 | Li et al. | 438/3 |
| 2003/0107067 A1 * | 6/2003 | Gudesen | 257/295 |
| 2003/0224535 A1 * | 12/2003 | Andideh et al. | 438/3 |

* cited by examiner

*Primary Examiner*—Trung Dang
(74) *Attorney, Agent, or Firm*—Troutman Sanders LLP

(57) ABSTRACT

Some embodiments for a method to fill interlayer vias with a suitable metal in a ferroelectric polymer memory die to reduce the step height and improve the thermal and electrical properties of the via. The method uses an electroless plating method to fill the vias, which is compatible with the ferroelectric polymer memory die processing temperature limits. The resulting process produces via fill metal plugs in the ferroelectric memory die, which allows for the deposition of a thin metal layer over the vias, while at the same time improving the electrical and thermal properties of the vias. Other embodiments are described and claimed herein.

24 Claims, 3 Drawing Sheets

METHOD AND APPARATUS FOR FILLING INTERLAYER VIAS ON FERROELECTRIC POLYMER SUBSTRATES

BACKGROUND

Ferroelectric polymers have generated a great deal of interest for use in semiconductor devices, especially memory devices, due to its fast polarization reversal in the presence of an electric field and its ability to maintain a polarization state once the electric field is removed. For this reason, ferroelectric polymers are being considered for use in stacked ferroelectric memory arrays. The memory arrays are formed by connecting the metal layers through a series of interlayer vias on a ferroelectric polymer memory die.

There are however, several problems associated with forming the interlayer vias in ferroelectric polymer memories dies. First, in forming the interlayer vias on a ferroelectric polymer die, the vias are patterned on a stack of interlevel dielectric (ILD) layers, which are typically an oxide, and the ferroelectric polymer layer. However, the ferroelectric polymer layer has a different etch rate than the oxide. Additionally, the ferroelectric polymer has a lateral etch rate that is equal to or greater than the vertical etch rate. Therefore, in the process of etching the via pattern, and removing the patterned photoresist, the difference in etch rates in the ferroelectric polymer layer results in a via sidewall that is retrograde from the ILD layer. As a result of the retrograde via sidewall, the next metal layer cannot be easily deposited on the sidewall of the vias, which results in marginal electrical continuity between adjoining metal layers.

Second, the topography of the ferroelectric polymer memory die increases with each additional metallization layers because the vias are not filled with metal and therefore, are not coplanar with the ILD layer. The lack of planarization limits the number of metallization layers and therefore decreases the memory density.

Another problem is that ferroelectric polymer memory dies require low temperature processing, typically below 120 degrees Celsius. This is due to the fact that ferroelectric polymers have a Currie temperature of about 120 degrees Celsius. Therefore, conventional chemical vapor deposition (CVD) processes cannot be used with ferroelectric polymers since the CVD process typically takes place between 300 and 500 degrees Celsius well above the Currie temperature of ferroelectric polymers. Therefore, any attempt use a CVD process to fill the vias will result in the ferroelectric polymer breaking down.

One method to attempt to improve the coverage of the via sidewalls is simply to increase the thickness of the metal layer deposited on the ILD layer, which deposits more metal in the via, thereby improving the sidewall coverage. However, this approach has several drawbacks. First, increasing the thickness of the metal layer deposited increases the overall topography of the ferroelectric polymer and metal stack, which reduces the ability to stack multiple metallization layers on a single die. The limitation occurs because typically, in memory dies, the patterned lines and spaces are about 150 to 250 nanometers in width. To meet these patterning requirements and maintain reasonable process operating windows, the thickness of the metal layer should be less than one thousand angstroms (1000 Å). Increasing the metal layer beyond 1000 Å makes it difficult and therefore, more expensive to effectively pattern the metal layer to the required specifications. Lastly, the metal layer has a different thermal expansion coefficient than the ILD layer. Increasing the thickness of the metal layer may lead to a build up of stresses at the metal-ILD junction, which may cause the oxide layer to delaminate, and render the device useless.

DETAILED DESCRIPTION OF THE EMBODIMENTS

Figure 1:
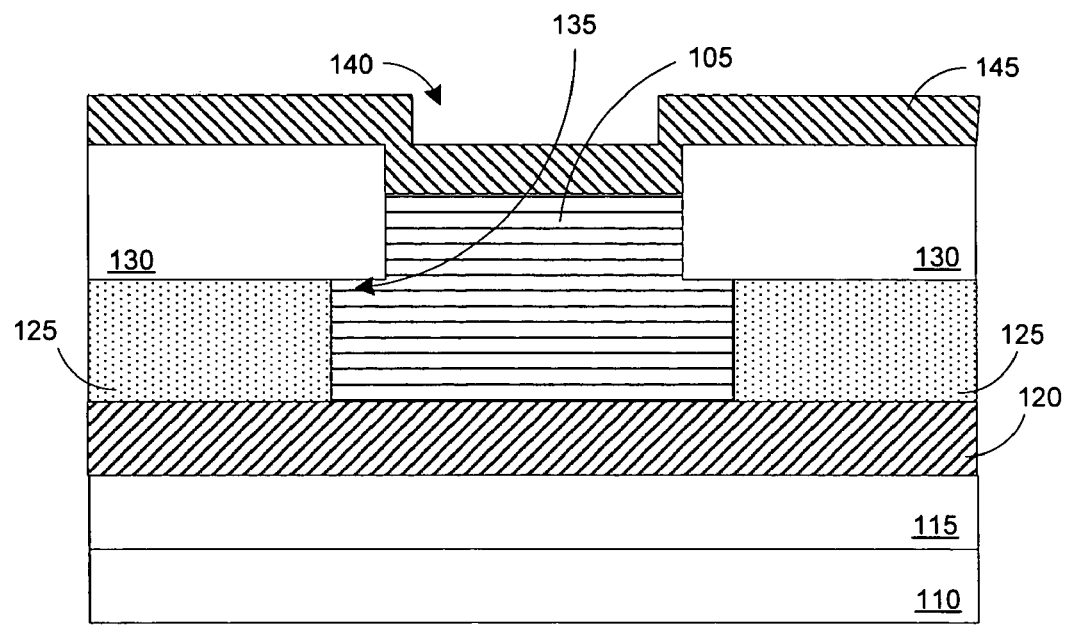
FIG. 1 is a cross-sectional view of a ferroelectric polymer memory die with a via fill plug used in some embodiments of the present invention.

The present invention is typically embodied in a method for creating an interlayer via plug to connect two separate metal layers within a ferroelectric polymer stack memory die. The ferroelectric polymer semiconductor die consists of a stack of a silicon (Si) substrate, an oxide layer, typically silicon dioxide ($SiO_2$), a first metal layer, a ferroelectric polymer layer, an interlevel dielectric (ILD) layer and a second metal layer. The interlayer via plugs are formed by first placing a layer of photoresist on the top of the ILD layer. A lithographic pattern is used to define the size and location of the vias on the ferroelectric polymer semiconductor die. It should be noted that the ratio of the width of the via to the combined thickness of the ferroelectric polymer layer and the ILD layer is roughly (1–1.5):1. This allows adequate conductivity between the metal layers. However, it is anticipated that materials with high dielectric constants will allow the ILD layer to be made thinner, and thereby reducing the ratio of the via width to the combined width of the ferroelectric polymer and ILD layers.

Once the locations of the interlayer vias have been laid out, the vias are etched using standard processes. The vias are etched through the ILD layer and the ferroelectric polymer layer, down to the first metal layer. The etching process is typically performed in two stages in order to account for the different etch rates between the ILD layer and the ferroelectric polymer layer. First, the ILD layer is etched using a plasma etch process, or other standard etching process. Then the ferroelectric polymer layer is etched using a plasma etch process to expose the first metal layer. During the etching process of the ferroelectric polymer layer, an undercut in the ferroelectric layer will likely be formed due to the ferroelectric polymer having a high lateral etch rate, which leads to reduced lateral etch control during the plasma etch process. Once the vias are etched, the photoresist layer is removed using a plasma ash/etch process. However, during this process, the undercut region in the ferroelectric polymer layer may worsen due to the difficulty in controlling the lateral etch rate.

Next, the vias are selectively filled using a suitable metal such as nickel (Ni) through an electroless plating process. Although the exemplary embodiment uses Ni as the via fill metal, those skilled in the art will appreciate that other metals, such as cobalt (Co), chromium (Cr), Iron (Fe), tin (Sn), copper (Cu), gold (Ag), silver (Au), palladium (Pd), platinum (Pt), ruthenium (Ru), rhodium (Rh), iridium (Ir), osmium (Os), their alloys and metalloids, such as phosphorous (P), boron (B), nitrogen (N), and silicon (Si) in a ferroelectric polymer may be used as the via fill metal without departing from the scope of the invention.

The electroless plating process is an oxidation-reduction process and begins by placing the ferroelectric polymer semiconductor die in an activation solution, which is made from metal chloride solution. Typically, the metal chloride solution is a palladium chloride ($PdCl_2$) solution with a concentration of approximately 0.2–2 grams per liter in combination with an acid such as hydrochloric acid (HCl) or hydrofluoric acid (HF) to maintain the pH of the solution between 1 and 2. The ferroelectric polymer semiconductor die is placed in the activation solution for approximately 2–60 seconds, which is held a constant temperature between 20–90 degrees Celsius.

Once the metal layer at the bottom of the vias is activated, the ferroelectric polymer memory die is rinsed in ultra pure water (UPW) to halt the activation process. Next, the ferroelectric polymer memory die is placed in a metal plating solution, such as nickel chloride ($NiCl_2$) at a concentration of approximately 20–40 grams per liter. The plating solution also contains buffer and complexing agents, such as citric acid, and a pH adjuster, such as potassium hydroxide (KOH) or tetra methyl ammonium hydroxide (TMAH) to maintain the pH of the plating solution between 8 and 11, and a reducing agent such as hypophosphite. The ferroelectric polymer memory die is suspended in the plating solution until the required amount of the via fill metal has grown in the via. Typically, the via fill metal will grow at a rate of 300–500 Å per minute, depending upon the temperature of the plating solution. Once the desired growth of the fill metal is achieved, the ferroelectric die is removed and rinsed again in UPW to remove excess plating material and halt the plating process. The ferroelectric polymer semiconductor die is then allowed to dry. As a result, a NiP metalloid plug is deposited within the interlayer via.

In an exemplary embodiment, the growth of the interlayer via metal plug is halted so that the top of the interlayer via plug is slightly below the top of the ILD layer. In an exemplary embodiment, the top of the via fill metal is approximately 20 nanometers below the level of the ILD layer. Keeping the via fill metal below the level of the ILD layer prevents the via fill metal from "ballooning" or extending over the top of the ILD layer. This in turn, avoids the added step of polishing the interlayer via plug back to the level of the ILD layer.

After the interlayer via plug has been deposited in the via, a second metal layer is patterned and deposited on top of the ILD layer and over the via. The second metal layer is deposited through a low temperature process, such as evaporation, sputtering, or electroless plating. The interlayer via plug provides several advantages over depositing metal on the walls of the via. First, the interlayer via plug results in a reduced step height between the top of the ILD layer and the top of the via fill metal plug. As a result, the thickness of the second layer metal can be reduced without compromising the electrical continuity of the via. This allows for stacking additional metallization layers to create stacked ferroelectric memory devices, such as stacked memory arrays.

Second, the interlayer via plug has a larger surface area than the metal deposited only on the walls of the via, which itself has several advantages. For instance, the larger surface area provides greater electrical conductivity between the first and second metal layers. Additionally, the larger surface area can dissipate heat generated by the current flowing through the via more efficiently than the metal merely coating the inside of the via walls. Furthermore, the via fill metal plugs may also dissipate heat built up within ferroelectric polymer. The ferroelectric polymer itself does not easily dissipate heat, so any heat that builds up in the ferroelectric polymer may migrate to the via fill metal plugs where it can be dissipated. Finally, interlayer via plug can be used to conformally fill the retrograde via profile, thereby providing improved electrical continuity and minimizing or eliminating discontinuities in the via fill metal due to effects of the retrograde profile.

Alternatively, there may however, be occasions when it is desirable to have the via fill plug coplanar with the ILD layer. In these instances, the interlayer via plug may be grown during the electroless plating process so that the top of the interlayer via plug extends beyond the top of the ILD layer. Once the desired growth for the interlayer via plug is obtained, it is polished down so that the top of the interlayer via plug is coplanar with the level of the ILD layer. In reality, however, the polishing process produces a slight recess at the via so that there is slight, although negligible step height between the ILD layer and the via fill metal plug. Thus, when the second metal layer is patterned and deposited on the ILD layer, the second metal layer forms a thin, planar layer across the via fill metal plug.

Turning now to the figures, in which like numerals refer to like elements through the several figures, FIG. 1 is a cross-sectional view of an interlayer via plug 105 within a ferroelectric polymer memory 100. Although the invention is described in terms of a ferroelectric polymer memory die 100, those skilled in the art will appreciate that may implemented within any semiconductor die without departing from the scope of the invention. Furthermore, the ferroelectric polymer memory die 100 is made up of several layers of materials. Cross hatching patterns are used to differentiate one layer from another and are not intended to represent conventional symbols. In addition, for simplicity, the invention will be described in regards to a ferroelectric memory die with a single metallization layer. However, those skilled in the art will appreciate that the invention may be applied to a ferroelectric polymer memory die having multiple metallization layers stacked on top of one another.

The ferroelectric polymer memory die 100 is made up of a number of layers of materials, which include a substrate layer 110. Typically, the substrate layer is composed of silicon (Si). An insulating oxide layer 115 sits on top of the Si substrate layer 110. In an exemplary embodiment, the insulating oxide layer is composed of silicon dioxide $SiO_2$, however those skilled in the art will appreciate that other dielectrics, such as silicon oxy-fluoride ($SiO_xF_{1-x}$) and the like may be used without departing from the scope of the invention. Normally, the thermal oxide insulating layer 115 has a thickness between 10 and 500 nanometers, depending on the application that the ferroelectric polymer memory die 100 will be used.

The next layer is a metal 1 layer 120 that sits on the thermal oxide insulating layer 115. The metal 1 layer may be composed of a single metal or a "stack" of metals. Typically, when a single metal is used for the metal 1 layer 120, aluminum (Al) is chosen. However, other metal such as titanium (Ti), copper (Cu), gold (Au), silver (Ag), nickel (Ni), cobalt (Co), platinum (Pt), palladium (Pd) and their alloys may be used as the metal 1 layer 120. However, when large currents are passed through the Al metal layer, electro migration may occur, which will cause the metal 1 layer 120 to exhibit increasing resistance with time. This increasing resistance may result in device failure. To counter the effects of electro migration, the metal 1 layer 120 may be composed of a "stack" of metals. When a stack of metals is used for the metal 1 layer 120, the stack is typically composed of a layer of titanium (Ti), a layer of Al, another layer of Ti, and a layer of titanium nitride (TiN). Those skilled in the art will appreciate that other combination of stacked metals may be used without departing from the scope of the invention.

The metal 1 layer 120 has a thickness in the range of 20 nanometers to 100 nanometers. The next layer on the ferroelectric die is a ferroelectric polymer layer 125. In the figure, the ferroelectric polymer layer 125 contains an undercut region 135 due to the inability to adequately control of the lateral etch rate of the ferroelectric polymer during the etch process. Finally, an interlevel dielectric (ILD) layer 130 is top of the ferroelectric polymer layer 125. The final layer on the ferroelectric polymer memory die 100 is a metal 2 layer 145. Typically, the metal 2 layer 145 has a thickness between 20–100 nanometers. It is desirable to keep thickness of the metal 2 layer 145 down to a minimum to allow multiple metallization layers to be stacked on top of one another. If the metal 2 layer become too thick, then the topography of the die increases, which limits the number of metallization layers that may be stacked on top of one another.

The ferroelectric polymer memory die 100 also contains a number of via fill metal plugs 105 that are used to connect the metal 1 layer 120 to the metal 2 layer 145. Although the figure illustrates a single interlayer via plug 105 for clarity, those skilled in the art will appreciate that the number of interlayer via plugs 105 that may be contained with a given ferroelectric polymer memory die 100 is only limited by the physical dimensions of the ferroelectric polymer memory die 100. The interlayer via plug 105 extends from the metal 120 through the ferroelectric polymer layer 125 and through the ILD layer 130. In the exemplary embodiment, the growth of the fill metal is stopped before the top of the interlayer via plug 105 reaches the top of the ILD layer 130. Typically, the top of the interlayer via plug is about 20 nanometers below the level of the ILD layer 130. Under filling the interlayer via reduces the step height between the ILD layer 130 and the top of the interlayer via plug while providing an increase in the electrical continuity across the via. However, under filling the via creates a small step 140 in the metal 2 layer 145 at the via. The step 140 is a tolerated side effect of under filling the via. Typically, the height of the step 140 is approximately one third (⅓) of the thickness of the metal 2 layer 145. By limiting the step height of the metal 2 layer 145 at the via, the thickness of the metal 2 layer 145 can be kept thin, typically between 20 and 100 nanometers. Therefore, the depth of the reduced step height is approximately in the range of approximately, 6–40 nanometers below the level of the metal 2 layer 145. If the depth of the step 140 is greater than ⅓ the thickness of the metal 2 layer 145, then the metal 2 layer 145 will fail to fill the via, which could result in inadequate electrical continuity.

Figure 2:
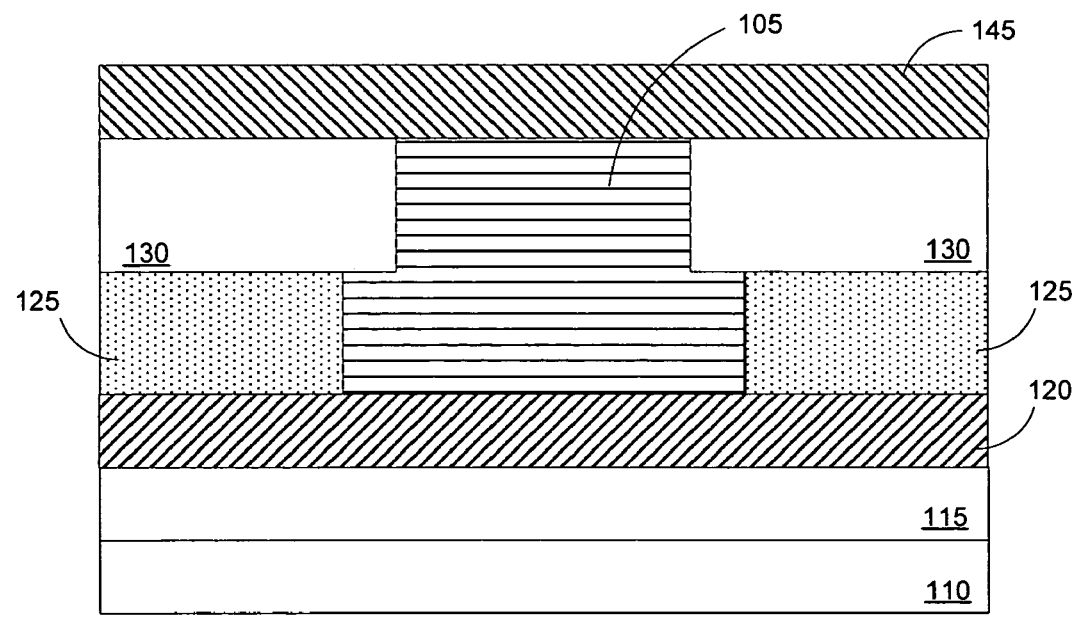
FIG. 2 is a cross-sectional view of an alternative embodiment of the ferroelectric polymer memory die with a via fill plug used in some embodiments of the present invention.

FIG. 2 is a cross-sectional view of an alternative embodiment of the interlayer via plug 105 within a ferroelectric polymer memory die 100. In the alternative embodiment, the interlayer via plug 105 is coplanar with the top of the ILD layer 130. The interlayer via plug 105 is grown so that it balloons over the top of the ILD layer 130 and then is polished flush with the top of the ILD layer 130. Because the interlayer via plug 105 is coplanar with the ILD layer 130, the metal 2 layer 145 may be deposited in a thin, planar configuration so that the step height at the vias are eliminated.

Figure 3:
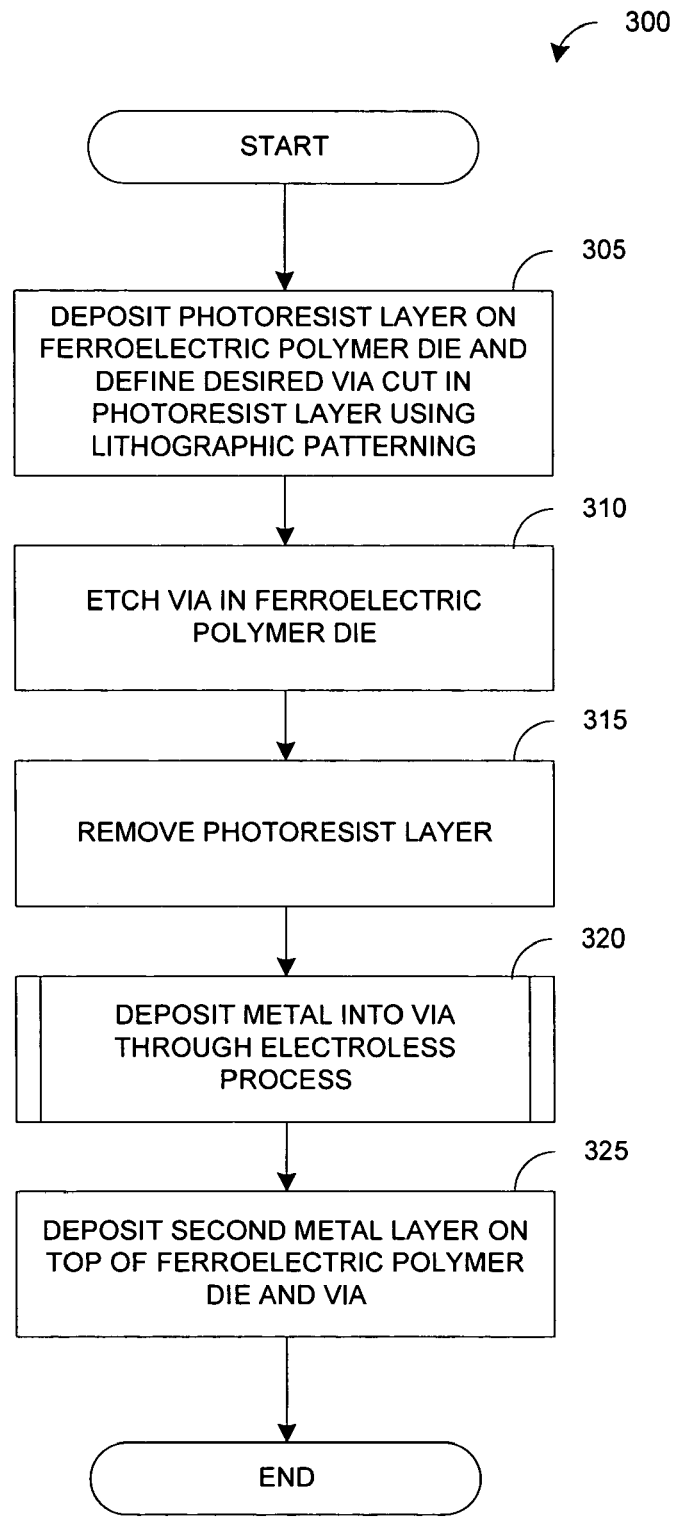
FIG. 3 is a logic flow diagram illustrating a method for filling interlayer vias on the ferroelectric polymer memory die used in some embodiments of the present invention.

FIG. 3 is a logic flow diagram illustrating a routine 300 for creating an interlayer via fill through an electroless plating process. Routine 300 begins at 305, in which a photoresist layer is deposited on the top of the ferroelectric memory die 100. The photoresist layer is placed on the ferroelectric memory die 100 in conjunction with a lithographic mask that contains the desired locations and sizes for the interlayer vias. Typically, the width of the interlayer vias are on the order of about 1 to 1.5 times the combined thickness of the ILD layer 130 and the ferroelectric polymer layer 125.

At 310, the interlayer vias are etched in the ferroelectric memory die 100. The etching process is typically a two step process. This is due to the fact that the etch rate of the ILD layer 130 is different than the etch rate for the ferroelectric polymer layer 125. First, the ILD layer 130 is etched using standard etching techniques, such as plasma etching. Next, the via is etched in the ferroelectric polymer layer 125, again using standard etching techniques. The two-step process allows for the etch rates of each layer to be controlled separately, which allows for tighter tolerances and greater accuracy. For example, the ferroelectric polymer layer 125 has a lateral etch rate that is faster than the vertical etch rate, which produces an undercut region 135 (FIG. 1). However, the undercut region 135 may be reduced or possibly eliminated by optimizing the etch rates for the ferroelectric polymer layer 125. By increasing the etch rate through the ferroelectric polymer layer 125 and subsequently reducing the amount of time that the plasma etch is in contact with the ferroelectric polymer layer 125, the undercut region 135 may be minimized.

Once the interlayer vias have been etched, the photoresist layer is removed from the ferroelectric memory die 100 at 315. The photoresist layer may be removed using standard plasma/ash etch process or any other suitable process for removing photoresist films. However, the plasma/ash etch process has an adverse effect on the ferroelectric polymer layer 125, in that it increases the undercut region 135. Therefore, the rate of the plasma/ash etch process is set such that the rate that the photoresist layer is removed, is greater than the etch rate for the ferroelectric polymer layer 125, described above. Increasing the rate that the photoresist layer is removed limits that time that the plasma/ash etch material is in contact with the ferroelectric polymer layer 125, and thus decreases any the lateral etching of the ferroelectric polymer.

At 320 the fill metal is deposited into the interlayer via through an electroless plating process. The fill metal, which is typically Ni, is deposited in the via so as to conformally fill the via, thus creating a interlayer via plug 105. Although the fill metal in the exemplary embodiment is Ni, those skilled in the art will appreciate that other suitable metals such as, Co, Cr, Fe, Sn, noble metals such as Cu, Ag, Au, Pd, Pt, Ru, Rh, Ir, and Os, their alloys and metal alloys with metalloids such as P, B, N, and Si in a ferroelectric polymer may be used for the fill metal to create the interlayer via plug 105 without departing from the scope of the invention.

The metal 1 layer 120 acts as a seed layer for the selective growth of the fill metal. In the exemplary embodiment, fill metal is grown within the via until the top of the level of the fill metal is slightly below the level of the ILD layer 130. Keeping the level of the fill metal slightly below the level of the ILD layer 130 has the advantage of avoiding the fill metal ballooning over the top of the ILD layer 130, which eliminates an additional step in the process of grinding, or polishing, the interlayer via plug 105 so that it is coplanar with the top of the ILD layer 130.

Lastly, at 325, the metal 2 layer 145 is deposited on top of the ferroelectric polymer memory die 100. The metal 2 layer 145 is typically deposited using a low temperature process, such as low temperature evaporation deposition, sputtering, electroplating, electroless plating, and the like. In the exemplary embodiment, in which the top of the interlayer via plug 105 lies below the top of the ILD layer 130, the deposited metal 2 layer 105 forms a reduced step height at each via. The reduced step height in turn causes step 140 within the metal 2 layer 145, which is a tolerable side effect of under filling the via.

Figure 4:
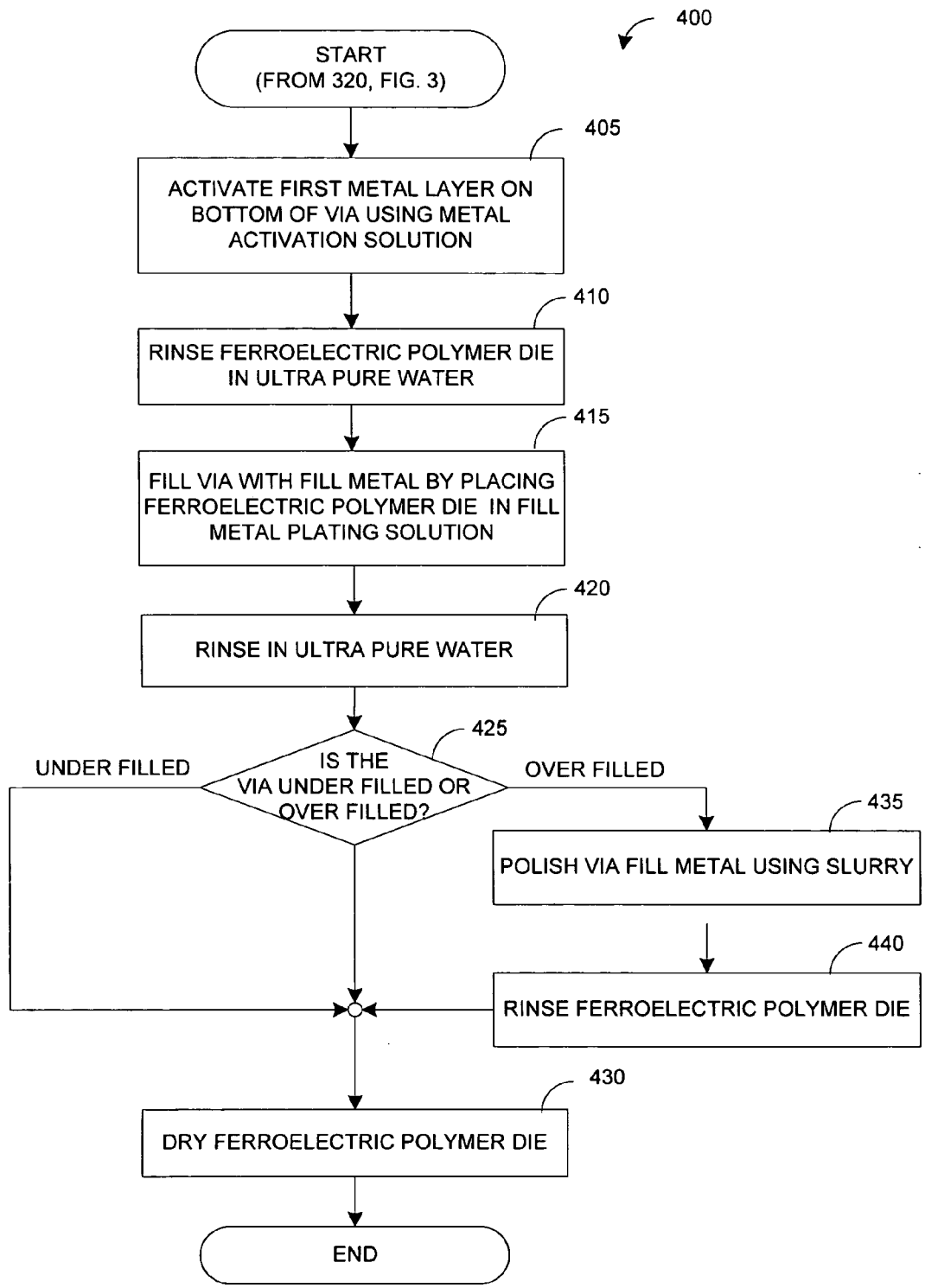
FIG. 4 is a logic flow diagram illustrating a method for growing the interlayer via plug using an electroless plating process used in some embodiments of the present invention.

FIG. 4 is a logic flow diagram illustrating routine 400 from 320 of FIG. 3 for depositing the fill metal in the via using an electroless plating process. Routine 400 begins at 405, in which the metal layer 1 120 at the bottom of the via is activated using a metal activation solution. The metal activation solution is typically a mixture of a palladium chloride ($PdCl_2$) solution at a concentration of 0.2–2.0 grams per liter and a solution of hydrochloric acid (HCL) or hydrofluoric acid (HF) to maintain the pH level of the solution of about one to two. The ferroelectric polymer memory die 100 is placed in the $PdCl_2$ solution, which is held at a temperature between 20 degrees Celsius (room temperature) to about 90 degrees Celsius, for a predetermined period of time ranging between two seconds to two (2) minutes.

Once the metal layer 1 120 has been activated, the ferroelectric polymer memory die 100 is rinsed in ultra pure water (UPW) at 410 to remove the activation solution and stop the oxidation-reduction process. Next, at 415, the via is filled with a fill metal by placing the ferroelectric polymer memory die 100 in an appropriate plating solution. Typically, the via is plated with Ni by placing the stack in a Ni solution, which is made up of $NiCl_2.6H_2O$ having a concentration of 20–40 g/l, a citric acid solution with a concentration of 50–100 g/l and hypophosphite solution with a concentration of 10–30 g/l. The plating solution is heated to a temperature of 40–80 degrees Celsius. This produces a plating rate in the range of about 10–100 nanometer per minute. Therefore, to grow a fill metal plug 105 having a thickness of 300 nanometers, or 3000 Å, the ferroelectric polymer memory die 100 is placed in the plating solution for a period time ranging between 3 and 30 minutes.

At 420 after the requisite amount of time has elapsed to grow the fill metal plug 105 to the desired level, the ferroelectric polymer memory die 100 is removed from the plating solution and again rinsed in UPW to remove any remaining plating solution and stop the plating process. Once all of the plating solution is removed, a determination is made at 425 whether the via has been under filled with the vial metal or over filled with the via metal. If the determination is made that the via has been under filled, the "UNDER FILLED" branch is followed to the 430, where the ferroelectric polymer memory die 100 is allowed to dry.

However, if the via has been overfilled, then the "OVER FILLED" branch is followed to 435, where the via metal is polished down so that the via metal is substantially coplanar with the ILD layer 130. The metal is polished using a typical slurry comprised of abrasives such as silica ($SiO_2$), ceria ($CeO_2$), and the like in combination with the appropriate chemicals to react with the via fill metal. The ferroelectric polymer memory die 100 is placed face down on an abrasive pad and gently rotated while the slurry compound passes over the ferroelectric polymer memory die 100. The slurry and mechanical polishing interact to remove the excess via fill metal. Once the via fill metal has been polished to the point where it is substantially coplanar with the ILD layer 130, the ferroelectric polymer memory die 100 is then rinsed to halt the oxidation reaction and remove any remaining slurry compound at 440. The ferroelectric polymer memory die 100 may be rinsed in UPW or an appropriate chemical solution which will neutralize the oxidation process of the slurry compound. Routine 400 then proceeds to 430, where the ferroelectric die is allowed to dry.

Other alternative embodiments will become apparent to those skilled in the art to which an exemplary embodiment pertains without departing from its spirit and scope. Accordingly, the scope of the present invention is defined by the appended claims rather than the foregoing description.

We claim:

1. A method, comprising:
   creating at least one interlayer via by etching a portion of an interlevel dielectric (ILD) layer and a portion of a ferroelectric polymer layer of a ferroelectric polymer die down to a first metal layer;
   filling the at least one interlayer via with a fill metal by depositing the fill metal in the vias through an electroless plating process; and
   depositing a second metal layer over the ILD layer and the at least one filled interlayer via.

2. The method of claim 1, wherein filling the via with the fill metal comprises depositing the fill metal to a level where the top of the fill metal is below the top of the ILD layer.

3. The method of claim 1, wherein to fill the vias with the fill metal comprises;
   filling the at least one interlayer via to a level where the top off the fill metal is above the top of the ILD layer; and
   polishing the fill metal until the top of the fill metal is level with the top the ILD layer.

4. The method of claim 1, wherein the fill metal is selected from a list consisting essentially of nickel (Ni), cobalt (Co), chromium (Cr), iron (Fe), tin (Sn), copper (Cu), silver (Ag), gold (Au), palladium (Pd), platinum (Pt), ruthenium (Ru), rhodium (Rh), iridium (Ir), osmium (Os), and metal alloys thereof, and alloys with metalloids consisting essentially of phosphorous (P), boron (B), nitrogen (N), and silicon (Si).

5. The method of claim 1, wherein the electroless plating process comprises:
   activating the first metal layer by placing the ferroelectric polymer stack in a metal activation solution;
   rinsing the stack with ultra pure water (UPW);
   depositing the fill metal in the at least one interlayer via by placing the ferroelectric polymer die in a metal plating solution having a predefined concentration of metal and heated to a predefined temperature;
   rinsing the ferroelectric polymer die in UPW; and
   drying the ferroelectric polymer die.

6. The method of claim 1, wherein the first metal layer has a predetermined thickness in the range of 20 nanometers to 100 nanometers.

7. The method of claim 6, wherein the ferroelectric polymer layer has a predetermined thickness in the range of 40 nanometers to 200 nanometers.

8. The method of claim 7, wherein the ILD layer has a predetermined thickness of approximately 200–500 nanometers.

9. The method of claim 1, wherein the second metal layer has a predetermined thickness in the range of 20 nanometers to 100 nanometers.

10. The method of claim 5, wherein the activation solution is a palladium chloride ($PdCl_2$) solution having a concentration of about 0.2–2.0 grams per liter.

11. The method of claim 5, wherein the metal plating solution is a nickel chloride ($NiCl_2.6H2O$) solution having a concentration of approximately 20–40 grams per liter.

12. The method of claim 8, wherein creating at least one interlayer via comprises patterning a photoresist with an open area proximate to the location of the at least one via, wherein the width of the open area in the photoresist is approximately 1 to 1.5 times the thickness of the combined thickness of the ILD layer and the ferroelectric polymer layer.

13. A ferroelectric polymer die, comprising:
a silicon (Si) substrate;
an oxide thermal insulation layer on top of the Si substrate;
a first metal layer on top of the oxide layer;
a ferroelectric polymer on top of the first metal layer;
an interlevel dielectric (ILD) layer on top of the ferroelectric polymer layer;
a second metal layer on top of the ILD layer; and
a via metal fill plug passing through the ILD layer and the ferroelectric polymer layer to electrically connect the first metal layer to the second metal layer,
wherein the second metal layer has a thickness in the range of 20 nanometers to 100 nanometers.

14. The ferroelectric polymer die of claim 13, wherein the via metal fill plug is below the top of the ILD layer.

15. The ferroelectric polymer die of claim 14, wherein the second metal layer comprises a step at the via metal fill plug.

16. The ferroelectric polymer die of claim 15, wherein the step is less than one third the thickness of the second metal layer.

17. The ferroelectric polymer die of claim 13, wherein the via metal fill metal plug is coplanar with the ILD layer.

18. The ferroelectric polymer die of claim 17, wherein the second metal layer has a thickness in the range of 20 nanometers to 100 nanometers.

19. The ferroelectric polymer die of claim 13, wherein the interlayer via plug comprises a metal selected from a list consisting essentially of nickel (Ni), cobalt (Co), chromium (Cr), iron (Fe), tin (Sn), copper (Cu), silver (Ag), gold (Au), palladium (Pd), platinum (Pt), ruthenium (Ru), rhodium (Rh), indium (Ir), osmium (Os), and metal alloys thereof, and alloys with metalloids consisting essentially of phosphorous (P), boron (B), nitrogen (N), and silicon (Si).

20. A ferroelectric polymer memory die, comprising:
a silicon (Si) substrate;
an oxide thermal insulation layer on top of the Si substrate;
a plurality of metallization layers stacked on the oxide layer, wherein each metallization layer comprises:
a first metal layer;
a ferroelectric polymer layer on top of the first metal layer;
an interlevel dielectric (ILD) layer on top of the ferroelectric polymer layer; and
a second metal layer on top of the ILD layer; and
at least one via metal fill plug passing through the ILD layer and the ferroelectric polymer layer to electrically connect the first metal layer to the second metal layer.

21. The ferroelectric polymer die of claim 20, wherein the via metal fill plug is below the top of the ILD layer.

22. The ferroelectric polymer die of claim 20, wherein the second metal layer comprises a step at the via metal fill plug.

23. The ferroelectric polymer die of claim 20, wherein the interlayer via plug comprises a metal selected from a list consisting essentially of nickel (Ni), cobalt (Co), chromium (Cr), iron (Fe), tin (Sn), copper (Cu), silver (Ag), gold (Au), palladium (Pd), platinum (Pi), ruthenium (Ru), rhodium (Rh), iridium (Ir), osmium (Os), and metal alloys thereof, and alloys with metalloids consisting essentially of phosphorous (P), boron (B), nitrogen (N), and silicon (Si).

24. The ferroelectric polymer die of claim 19, wherein the interlayer via plug is formed by an electroless plating process.

* * * * *